(12) United States Patent
Hada

(10) Patent No.: US 10,204,769 B2
(45) Date of Patent: Feb. 12, 2019

(54) WIRE ELECTRIC DISCHARGE MACHINE

(71) Applicant: FANUC CORPORATION, Yamanashi (JP)

(72) Inventor: Keita Hada, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/795,711

(22) Filed: Oct. 27, 2017

(65) Prior Publication Data

US 2018/0122623 A1 May 3, 2018

(30) Foreign Application Priority Data

Nov. 1, 2016 (JP) ................................. 2016-214383

(51) Int. Cl.
*H01J 7/24* (2006.01)
*H01J 37/32* (2006.01)
*G05B 19/404* (2006.01)

(52) U.S. Cl.
CPC ...... *H01J 37/32724* (2013.01); *G05B 19/404* (2013.01); *H01J 37/32752* (2013.01);
(Continued)

(58) Field of Classification Search
CPC .................................................. G05B 19/404
(Continued)

(56) References Cited

U.S. PATENT DOCUMENTS

| | | | | |
|---|---|---|---|---|
| 5,523,953 | A | * | 6/1996 | Araie ................... G05B 19/404 700/193 |
| 8,835,869 | B2 | * | 9/2014 | Yevtukhov ............. H01J 27/18 250/396 ML |

(Continued)

FOREIGN PATENT DOCUMENTS

| | | |
|---|---|---|
| JP | H06-008107 A | 1/1994 |
| JP | H07-075937 A | 3/1995 |

(Continued)

OTHER PUBLICATIONS

Notification of Reasons for Refusal dated Feb. 6, 2018, from corresponding JP Appl No. 2016-214383, 3 pp.

(Continued)

*Primary Examiner* — Douglas W Owens
*Assistant Examiner* — Syed M Kaiser
(74) *Attorney, Agent, or Firm* — Studebaker & Brackett PC

(57) ABSTRACT

To provide a wire electric discharge machine capable of suitably and simply performing thermal displacement correction on upper and lower guides. Provided are a storage unit that stores temperatures of machine elements and actual values for relative positions of upper and lower guides to be associated with each other as associated data; and a relational expression calculation unit that infers and calculates a relational expression between the temperature of the machine element and the relative positions of the upper and lower guides by way of machine learning with this associated data as training data. Additionally provided are a position estimation unit that substitutes temperatures of the machine element into the relational expression and calculates an estimated value for the relative position of the upper and lower guides; and a correction amount calculation unit that calculates a correction amount for the upper and lower guides, based on the estimated value for the relative position. Further provided is a correction execution unit that performs correction of the relative position of the upper and lower guides based on this correction amount.

6 Claims, 7 Drawing Sheets

(52) U.S. Cl.
CPC .............. *G05B 2219/45221* (2013.01); *G05B 2219/49206* (2013.01); *G05B 2219/49209* (2013.01)

(58) Field of Classification Search
USPC ..................................................... 315/111.01
See application file for complete search history.

(56) References Cited

U.S. PATENT DOCUMENTS

| | | | | |
|---|---|---|---|---|
| 2006/0273732 | A1* | 12/2006 | Korobochko | H05G 2/003 315/111.21 |
| 2009/0204272 | A1* | 8/2009 | Yuzawa | G05B 19/27 700/302 |
| 2013/0090754 | A1* | 4/2013 | Abe | G05B 19/404 700/186 |
| 2013/0325164 | A1 | 12/2013 | Wwatanabe et al. | |
| 2014/0135975 | A1* | 5/2014 | Kobayashi | G05B 19/18 700/162 |
| 2015/0283636 | A1 | 10/2015 | Yoshizaki et al. | |
| 2017/0259363 | A1* | 9/2017 | Arcioni | B23H 9/10 |
| 2018/0122623 | A1* | 5/2018 | Hada | H01J 37/32724 |

FOREIGN PATENT DOCUMENTS

| | | |
|---|---|---|
| JP | H11-114776 A | 4/1999 |
| JP | 2003-039278 A | 2/2003 |
| JP | 2012-240137 A | 12/2012 |
| JP | 2015-009339 A | 1/2015 |
| JP | 5751611 B2 | 7/2015 |
| JP | 5870143 B2 | 2/2016 |
| WO | 2008015786 A | 2/2008 |

OTHER PUBLICATIONS

Extended European Search Report (EESR) dated Mar. 8, 2018, from corresponding EP Appl No. 17199133.4, 8 pp.

* cited by examiner

WIRE ELECTRIC DISCHARGE MACHINE

This application is based on and claims the benefit of priority from Japanese Patent Application No. 2016-214383, filed on 1 Nov. 2016, the content of which is incorporated herein by reference.

BACKGROUND OF THE INVENTION

Field of the Invention

The present invention relates to a wire electric discharge machine that performs electric discharge machining on a workpiece, by causing the workpiece and a wire electrode mounted between an upper guide and lower guide to relatively move, in a state in which the upper guide and lower guide are arranged at predetermined relative positions.

Related Art

Such a wire electric discharge machine is configured by a plurality of machine elements being combined, and the thermal expansion coefficients of these machine elements differ from each other. Therefore, due to factors such as a change in the temperature of the environment, there is concern over a plurality of machine elements thermally deforming and the relative positions of the upper guide and lower guide displacing in three-dimensional directions (X-axis direction, Y-axis direction, Z-axis direction). If positional shift in the horizontal direction (X-axis direction, Y-axis direction) occurs in particular, it will be directly linked to a decline in machining precision. Therefore, in order to prevent a change in the temperature of the environment, countermeasures for temperature management by installing the wire electric discharge machine in a temperature-controlled room or the like have also been considered; however, the investment of a great sum of capitol is required in order to install a temperature-controlled room of adequate performance.

For this reason, as a method of maintaining machining precision inexpensively, a technique of performing correction by assuming a thermal displacement amount of the upper and lower guides based on temperature information detected by a temperature sensors installed to various parts of the machine, so-called thermal displacement correction, has been proposed (for example, refer to Patent Documents 1 to 3).

Patent Document 1: Japanese Unexamined Patent Application, Publication No. H07-75937
Patent Document 2: Japanese Patent No. 5751611
Patent Document 3: Japanese Unexamined Patent Application, Publication No. 2015-9339

SUMMARY OF THE INVENTION

However, with the technology described in Patent Document 1, there is no mention of at which positions (machine elements) of what machine tool such as a wire electric discharge machine the temperature sensors should be installed. If a temperature sensor is not installed at a machine element which has a great influence on the thermal displacement amount, it will not be possible to assume an accurate thermal displacement amount. On the other hand, in the case of a temperature sensor being installed to a machine element which has almost no influence on the thermal displacement amount, this temperature sensor becomes wasteful. Therefore, as a thermal displacement correction made by anticipating so much as this kind of situation, it is necessarily not considered as appropriate.

In addition, with the technology described in Patent Document 2, since the thermal displacement amount of a machine tool is not necessary directly calculated, the obtained locations are not necessarily limited to locations of great influence on the thermal displacement amount. Therefore, similarly to the technology described in Patent Document 1, it is not necessarily considered as suitable thermal displacement correction.

Furthermore, with the technology described in Patent Document 3, structural analysis is performed by the finite element method, upon obtaining the optimum installation positions of temperature sensors, in a machine tool such as a horizontal machining center. For this reason, the contents of analysis become complicated, and handling becomes difficult. Therefore, it is not possible to simply perform thermal displacement correction.

The present invention takes into account such a situation, and has an object of providing a wire electric discharge machine capable of suitably and simply performing thermal displacement correction of upper and lower guides.

A wire electric discharge machine (e.g., the wire electric discharge machine 1 described later) according to a first aspect of the present invention is a wire electric discharge machine configured from a plurality of machine elements (e.g., the bed 2, column 3, X-axis saddle 9, Y-axis saddle 10, etc. described later), and performing electric discharge machining on a workpiece (e.g., the work W described later) in a state in which an upper guide (e.g., the upper guide 8 described later) and a lower guide (e.g., the lower guide 15 described later) are disposed at predetermined relative positions, by causing the workpiece and a wire electrode (e.g., the wire electrode 16 described later) installed between the upper guide and the lower guide to relatively move, the wire electric discharge machine including: a temperature detection means (e.g., the temperature sensors S1 to S7 described later) for detecting temperature of the machine element; a position measurement means (e.g., the position sensor S9 described later) for measuring an actual value for relative positions of the upper guide and the lower guide; a storage means (e.g., the storage unit 21 described later) for storing a temperature detected by the temperature detection means and an actual value for the relative position measured by the position measurement means to be associated with each other as associated data; a relational expression calculation means (e.g., the relational expression calculation unit 22 described later) for inferring and calculating a relational expression between the temperature of the machine element and the relative position by way of machine learning with the associated data stored in the storage means as training data; a position estimation means (e.g., the position estimation unit 23 described later) for calculating an estimated value for the relative position by substituting the temperature detected by the temperature detection means into the relational expression calculated by the relational expression calculation means; a correction amount calculation means (e.g., the correction amount calculation unit 24 described later) for calculating a correction amount for the upper guide and the lower guide, based on the estimated value for the relative position calculated by the position estimation means; and a correction execution means (e.g., the correction execution unit 25 described later) for performing correction of the relative positions of the upper guide and the lower guide, based on the correction amount calculated by the correction amount calculation means.

According to a second aspect of the present invention, the wire electric discharge machine as described in the first aspect may further include: a difference calculation means (e.g., the difference calculation unit 26 described later) for comparing the estimated value for the relative position calculated by the position estimation means with the actual value for the relative position among associated data stored in the storage means, and calculating a difference therebetween; and a relational expression decision means (e.g., the relational expression decision unit 27 described later) for deciding, in a case of the difference calculated by the difference calculation means being no more than a predetermined threshold, a relational expression used when calculating said estimated value for the relative position as a formal relational expression.

According to a third aspect of the present invention, the wire electric discharge machine as described in the second aspect may further include: a determination means (e.g., the determination unit 28 described later) for determining a magnitude of influence imparted by the temperature of the machine element on the correction amount for the upper guide and the lower guide, based on the relational expression decided as the formal relational expression by the relational expression decision means; and a relational expression modification means (e.g., the relational expression modification unit 29 described later) for modifying the relational expression decided as the formal relational expression by the relational expression decision means, by inferring a relational expression between the temperature of the machine element and the relative position by way of machine learning, with associated data excluding the temperature of the machine element as teaching data, in a case of the determination means determining that the influence imparted by the temperature of the machine element on the correction amount for the upper guide and the lower guide is small.

According to a fourth aspect of the present invention, the wire electric discharge machine as described in the second or third aspect may further include: a determination means (e.g., the determination unit 28 described later) for determining a magnitude of influence imparted by the temperature of the machine element on the correction amount for the upper guide and the lower guide, based on a relational expression decided as a formal relational expression by the relational expression decision means; and a notification means (e.g., the notification unit 30 described later) for notifying, in a case of the determination means determining that the influence imparted by the temperature of the machine element on the correction amount for the upper guide and the lower guide is small, that a temperature detection means detecting the temperature of said machine element can be removed.

According to a fifth aspect of the present invention, in the wire electric discharge machine as described in any one of the first to fourth aspects, the machine element may at least include a bed (e.g., the bed 2 described later), a U-axis saddle (e.g., the U-axis saddle 6 described later), and a work pan (e.g., the work pan 11 described later), and the temperature detection means may detect ambient temperature in a vicinity of the bed, temperature of the U-axis saddle, and temperature of a working fluid inside of the work pan.

According to the present invention, it is possible to calculate correction amount for upper and lower guides in a wire electric discharge machine, by way of machine learning (supervised learning) with associated data in which the temperature of machine elements and the actual value for the relative positions of the upper and lower guides are associated as teaching data. As a result thereof, it becomes possible to suitably and simply perform thermal displacement correction of the upper and lower guides.

DETAILED DESCRIPTION OF THE INVENTION

Hereinafter, a first embodiment of the present invention will be explained based on the drawings.

First Embodiment

Figure 1:
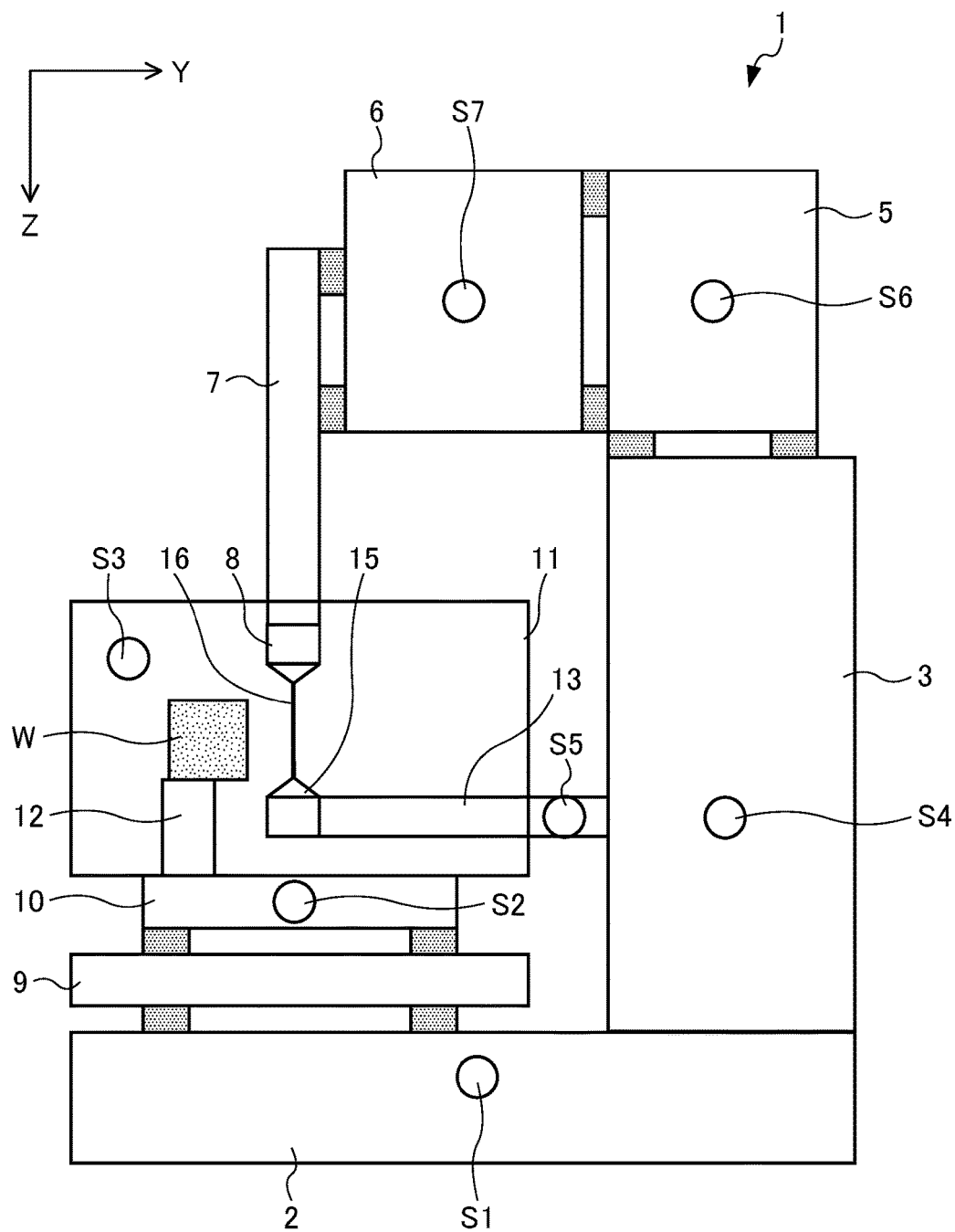
FIG. 1 is a front view showing an outline configuration of a wire electric discharge machine according to a first embodiment of the present invention.
Figure 2:
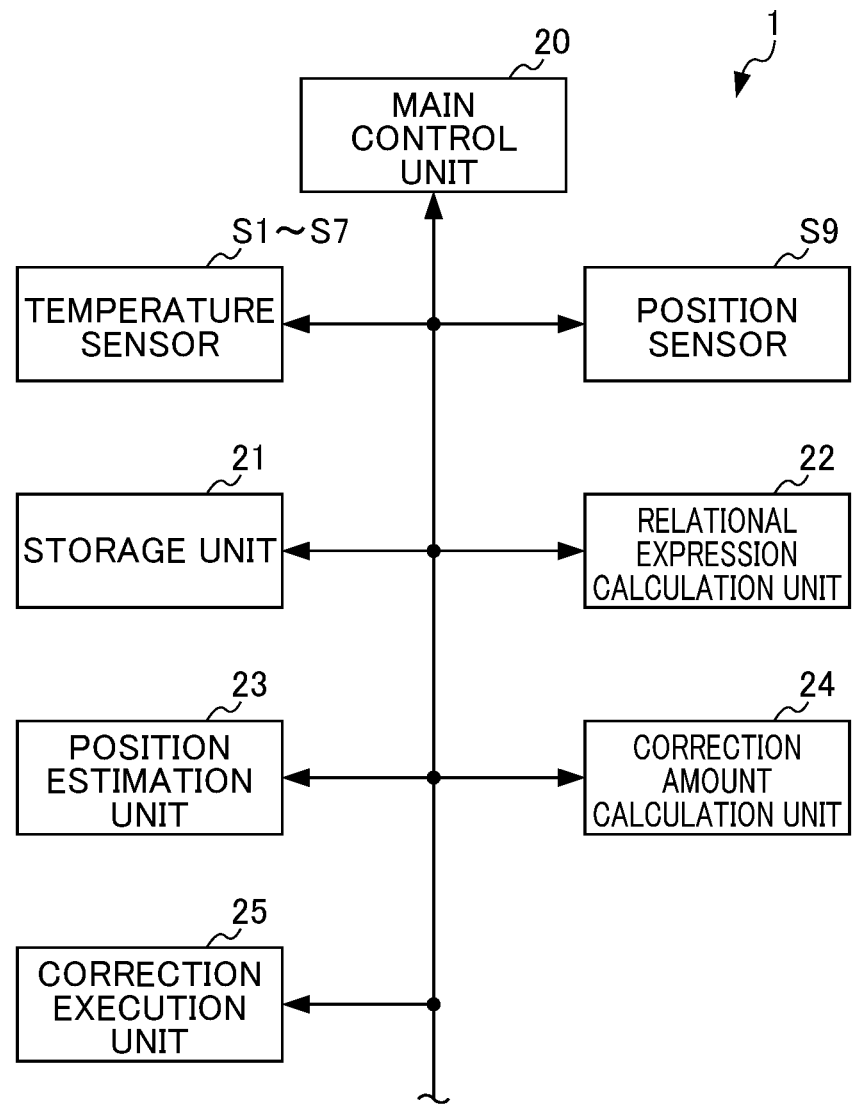
FIG. 2 is a block diagram showing a control system of the wire electric discharge machine according to the first embodiment of the present invention.
Figure 3:
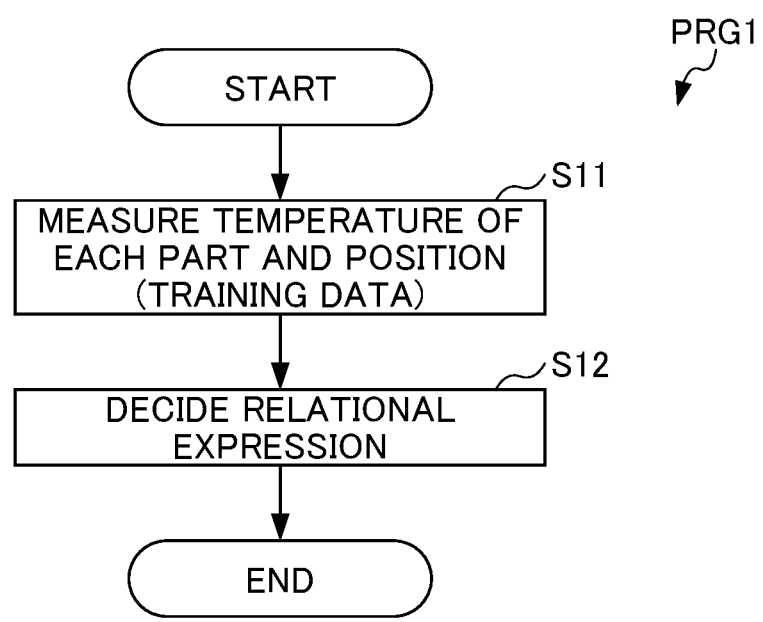
FIG. 3 is a flowchart showing a sequence of deciding a relational expression between the temperature of machine elements and relative positions of upper/lower guides, in the wire electric discharge machine according to the first embodiment of the present invention.

FIG. 1 is a front view showing an outline configuration of a wire electric discharge machine according to the first embodiment of the present invention. FIG. 2 is a block diagram showing a control system of this wire electric discharge machine. FIG. 3 is a flowchart showing a sequence of deciding a relational expression between the temperature of machine elements and relative positions of upper/lower guides, in this wire electric discharge machine.

The wire electric discharge machine 1 according to the first embodiment is configured from a plurality of machine elements such as a bed 2, column 3, V-axis saddle 5, U-axis saddle 6, Z-axis saddle 7, X-axis saddle 9, Y-axis saddle 10, work pan 11, work table 12, and arm 13.

Herein, the X-axis saddle 9 is equipped to freely move in the X-axis direction (direction perpendicular to plane of page of FIG. 1) at an upper side of the bed 2. The Y-axis saddle 10 is equipped to freely move in the Y-axis direction (left/right direction in FIG. 1) at an upper side of the X-axis saddle 9. The work pan 11 is equipped at the upper side of the Y-axis saddle 10. The work table 12 on which the work W serving as a workpiece is placed is installed inside of the work pan 11, and is filled with working fluid.

In addition, the column 3 is installed to stand at the upper side of the bed 2. The arm 13 is mounted horizontally to the lateral part of the column 3, and the lower guide 15 is mounted to the leading end of the arm 13 so as to be positioned inside of the work pan 11. The V-axis saddle 5 is equipped to freely move in the V-axis direction (Y-axis direction) at an upper side of the column 3. The U-axis saddle 6 is mounted to freely move in the U-axis direction (X-axis direction) at a lateral part of the V-axis saddle 5. The Z-axis saddle 7 is mounted to freely move in the Z-axis direction (up/down direction in FIG. 1) at a lateral part of the U-axis saddle 6. The upper guide 8 is mounted to the leading end of the Z-axis saddle 7 so as to be positioned above the lower guide 15 inside of the work pan 11. The wire electrode 16 is provided in a tensioned state linearly between the upper guide 8 and lower guide 15.

Furthermore, among these machine elements, a temperature sensor 3 is mounted as a temperature detection means to a few of these machine elements, respectively. In other words, a temperature sensor S1 that detects the temperature of the bed 2 is mounted to the bed 2. A temperature sensor S2 that detects the temperature of the Y-axis saddle 10 is mounted to the Y-axis saddle 10. A temperature sensor S3 that detects the temperature of the working fluid inside of the work pan 11 is mounted to the work pan 11. A temperature sensor S4 that detects the temperature of the column 3 is mounted to the column 3. A temperature sensor S5 that detects the temperature of the arm 13 is mounted to the arm 13. A temperature sensor S6 that detects the temperature of the V-axis saddle 5 is mounted to the V-axis saddle 5. A temperature sensor S7 that detects the temperature of the U-axis saddle 6 is mounted to the U-axis saddle 6.

Furthermore, the wire electric discharge machine 1 has a main control unit 20 as shown in FIG. 2. In addition to the aforementioned seven temperature sensors S (S1 to S7), a position sensor S9 serving as a position measurement means, a storage unit 21 serving as a storage means, a relational expression calculation unit 22 serving as a relational expression calculation means, a position estimation unit 23 serving as a position estimation means, a correction amount calculation unit 24 serving as a correction amount calculation means, and a correction execution unit 25 serving as a correction execution means are connected to the main control unit 20.

The position sensor S9 measures the actual value of relative positions of the upper/lower guides 8, 15 using a laser or the like.

The storage unit 21 stores the temperatures detected by each of the temperature sensors S1 to S7, and actual value of the relative positions of the upper/lower guides 8, 15 measured by the position sensor S9 to be associated with each other as associated data.

The relational expression calculation unit 22 infers and calculates a relational expression between the temperatures of the machine elements and the relative positions of the upper/lower guides 8, 15, with the associated data stored in the storage unit 21 as training data, by way of machine learning.

The position estimation unit 23 calculates estimated values for the relative positions of the upper/lower guides 8, 15 by substituting the temperatures detected by the respective temperature sensors S1 to S7 into the relational expression calculated by the relational expression calculation unit 22.

The correction amount calculation unit 24 calculates a correction amount for the upper/lower guides 8, 15 based on the estimated values for the relative positions of the upper/lower guides 8, 15 calculated by the position estimation unit 23.

The correction execution unit 25 performs correction of the relative positions of the upper/lower guides 8, 15 based on the correction amount for the upper/lower guides 8, 15 calculated by the correction amount calculation unit 24.

Since the wire electric discharge machine 1 has the above such configuration, the following sequence is followed upon performing electric discharge machining on a work W using this wire electric discharge machine 1. It should be noted that the electric discharge machining of this work W is executed based on the commands from the main control unit 20.

First, in response to the machined form of the work W, the upper guide 8 is positioned at a predetermined three-dimensional position relative to the lower guide 15, by causing the V-axis saddle 5, U-axis saddle 6 and Z-axis saddle 7 to move appropriately. Next, a high-frequency voltage is applied to the wire electrode 16 from a machining power supply (not illustrated). In this state, the work W is made to relatively move in relation to this wire electrode 16, by causing the X-axis saddle 9 to move in the X-axis direction, and causing the Y-axis saddle 10 to move in the Y-axis direction.

In electric discharge machining of the work W done in this way, there is concern over the relative positions of the upper/lower guides 8, 15 shifting due to factors such as a change in the temperature of the environment, and the machining precision declining. Therefore, in order to perform thermal displacement correction of the upper/lower guides 8, 15, prior to electric discharge machining of the work W, a relational expression between the temperatures of each machine element and the relative positions of the upper/lower guides 8, 15 is sought based on the relational expression decision program PRG1 shown in FIG. 3, as mentioned below. It should be noted that this thermal displacement correction is executed based on the commands from the main control unit 20. In addition, as stages for this thermal displacement correction, prior to factory delivery or during initial setting of the wire electric discharge machine 1, during maintenance, or the like are desired.

First, in Step S11, the storage unit 21 stores the output values of the respective temperature sensors S1 to S7 (temperatures of the bed 2, Y-axis saddle 10, working fluid inside of work pan 11, column 3, arm 13, V-axis saddle 5, and U-axis saddle 6), and the actual value of the relative positions of the upper/lower guides 8, 15 measured by the position sensor S9 at a plurality of arbitrary times to be associated with each other as associated data. At this time, the plurality of measurement times is preferably times at which the output values of the temperature sensors S1 to S7 differ.

Next, in Step S12, the relational expression calculation unit 22 infers and calculates the relational expression between the temperatures of each machine element and relative positions of the upper/lower guides 8, 15, with this associated data as training data, by way of machine learning. As the relational expression, the present embodiment uses the math expression of $D=C_1 T_1+C_2 T_2+ \ldots +C_7 T_7$ (i.e. first order polynomial). Herein, D represents the correction amount, $T_1$ to $T_7$ represent the output values of the respective temperature sensors S1 to S7, and $C_1$ to $C_7$ represent arbitrary factors.

Herein, the operations for obtaining the relational expression between the temperatures of each machine element and the relative positions of the upper/lower guides 8, 15 are completed.

Upon the relational expression between the temperatures of each machine element and the relative positions of the upper/lower guides 8, 15 being obtained by configuring in this way, this relational expression is stored. Then, upon electric discharge machining of the work W, thermal displacement correction of the upper/lower guides 8, 15 is performed using this relational expression.

In other words, first, the position estimation unit 23 calculates the estimated value for the relative positions of the upper/lower guides 8, 15, by substituting the temperatures of each machine element detected by the respective temperature sensors S1 to S7 in this relational expression. Next, the correction amount calculation unit 24 calculates the correction amount for the upper/lower guides 8, 15, based on the estimated value for the relative positions of these upper/lower guides 8, 15. Finally, the correction execution unit 25 performs correction of the relative positions of the upper/lower guides 8, 15, based on this correction amount of the upper/lower guides 8, 15.

In the above way, according to the present embodiment, it is possible to calculate the correction amount for the upper/lower guides 8, 15, by way of machine learning (supervised learning) with the associated data in which the temperatures of the machine elements and actual value for the relative positions of the upper/lower guides 8, 15 are associated as training data, in the wire electric discharge machine 1. As a result thereof, it becomes possible to suitably and simply perform thermal displacement correction of the upper/lower guides 8, 15.

Second Embodiment

Figure 4:
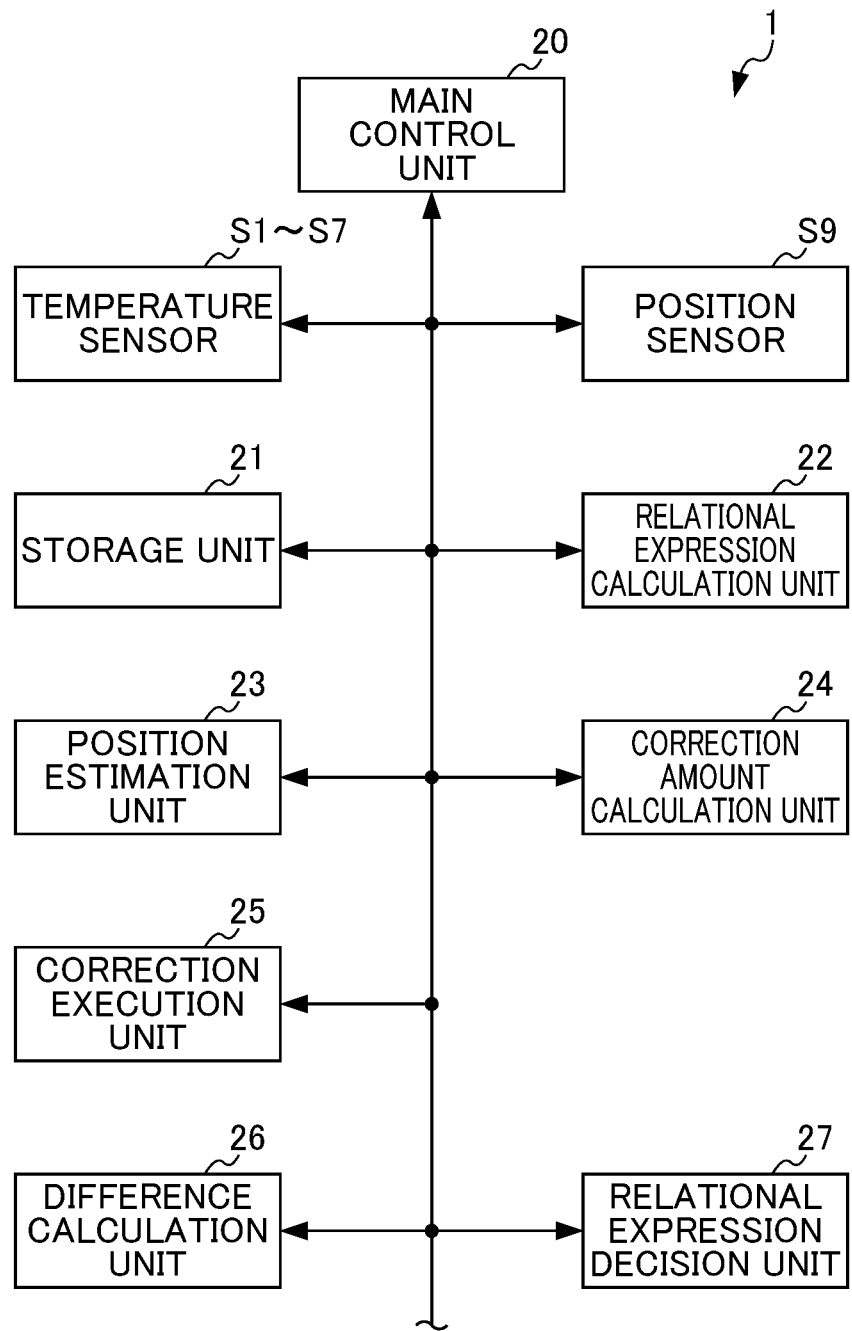
FIG. 4 is a block diagram showing a control system of a wire electric discharge machine according to a second embodiment of the present invention.
Figure 5:
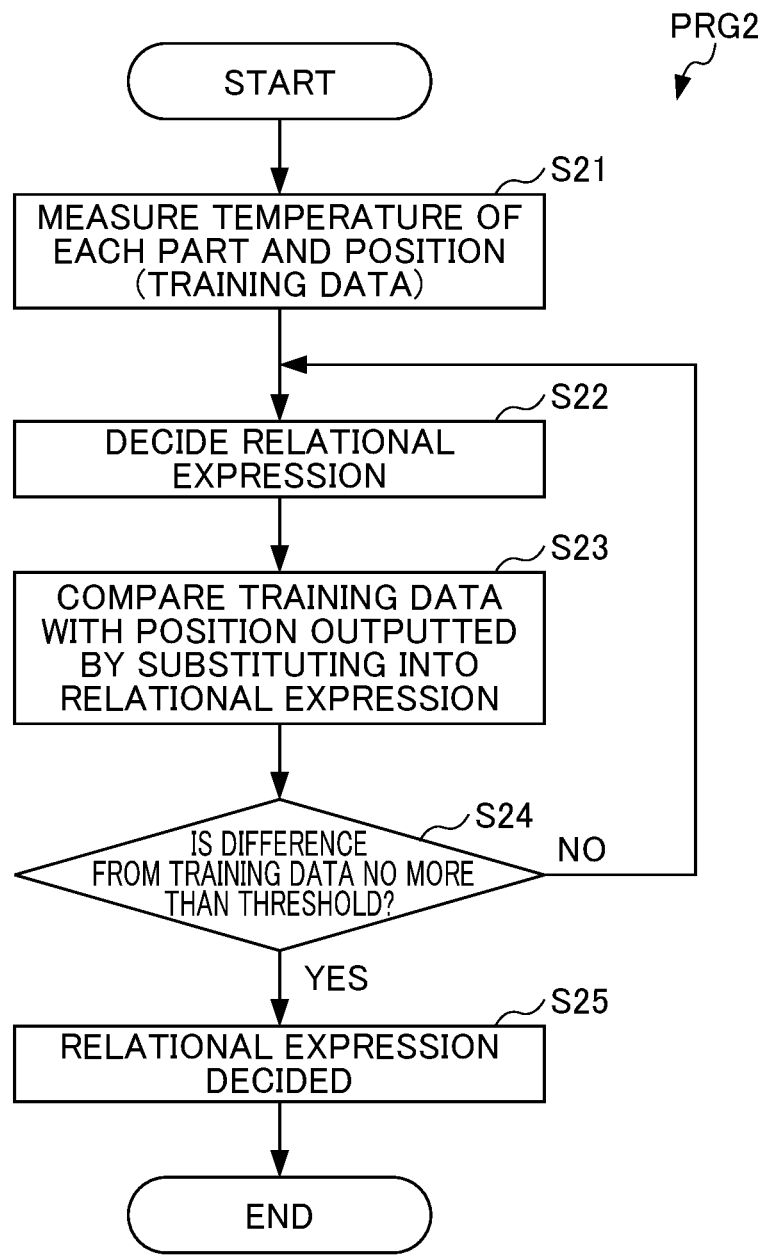
FIG. 5 is a flowchart showing a sequence of deciding a relational expression between the temperature of machine elements and relative positions of upper/lower guides, in the wire electric discharge machine according to the second embodiment of the present invention.

FIG. 4 is a block diagram showing a control system of a wire electric discharge machine according to a second embodiment of the present invention. FIG. 5 is a flowchart showing a sequence of deciding a relational expression between the temperatures of the machine element and relative positions of the upper/lower guides, in this wire electric discharge machine.

In the wire electric discharge machine 1 according to the second embodiment, a difference calculation unit 26 serving as a difference calculation means and a relational expression decision unit 27 serving as a relational expression decision means are added in the control system thereof, as shown in FIG. 4. Since other configurations are basically the same as the aforementioned first embodiment, the same reference symbols are assigned for identical members, and explanations thereof are omitted.

The difference calculation unit 26 compares the estimated value for the relative positions of the upper/lower guides 8, 15 calculated by the position estimation unit 23 with the actual value for the relative positions of the upper/lower guides 8, 15 in the associated data stored in the storage unit 21, and calculates the difference between both.

The relational expression decision unit 27 decides a relational expression used when calculating the estimated value for the relative positions of the upper/lower guides 8, 15 as a formal relational expression, in the case of the difference calculated by the difference calculation unit 26 being no more than a predetermined threshold.

Next, in the wire electric discharge machine 1 according to the present embodiment, a relational expression decision program PRG2 shown in FIG. 5 is followed upon obtaining the relational expression between the temperatures of each machine element and the relative positions of the upper/lower guides 8, 15.

First, in Step S21, the storage unit 21 executes the same processing as Step S11 in the aforementioned first embodiment.

Next, in Step S22, the relational expression calculation unit 22 executes the same processing as Step S12 in the aforementioned first embodiment.

Subsequently, in Step S23, the difference calculation unit 26 compares the estimated value for the relative positions of the upper/lower guides 8, 15 calculated by the position estimation unit 23 with the actual value for the relative positions of the upper/lower guides 8, 15 in the associated data stored in the storage unit 21, and calculates the difference between both.

Finally, in Step S24, the relational expression decision unit 27 determines whether or not this difference is no more than a predetermined threshold. In the case of this determination being NO (i.e. case of this difference exceeding a predetermined threshold), since it is considered that the probability of this relational expression being statistically reasonable is low, the processing returns to Step S22, and repeats the calculation of the relational expression by machine learning. On the other hand, in the case of this determination being YES (i.e. case of this difference being no more than the predetermined threshold), since it is considered that the probability of this relational expression being statistically reasonable is high, the processing advances to Step S25, and the relational expression decision unit 27 decides this relational expression as the formal relational expression.

Herein, the operations for obtaining the relational expression between the temperatures of each machine element and the relative positions of the upper/lower guides 8, 15 are completed.

Upon the relational expression between the temperature of each machine element and the relative positions of the upper/lower guides 8, 15 being obtained by configuring in this way, this relational expression is stored. Then, upon the electric discharge machining of the work W, the thermal displacement correction of the upper/lower guides 8, 15 is performed using this relational expression, according to a similar sequence as the aforementioned first embodiment.

In the above way, the present embodiment exerts the same functional effects as the aforementioned first embodiment. In addition thereto, according to the present embodiment, calculation of the relational expression by machine learning is repeated until a relational expression between the temperature of each machine element and the relative position of the upper/lower guides 8, 15 becomes a statistically appropriate expression. For this reason, it is possible to much more accurately calculate the correction amount for the upper/lower guides 8, 15, and thus it becomes possible to more suitably perform thermal displacement correction of the upper/lower guides 8, 15.

Third Embodiment

Figure 6:
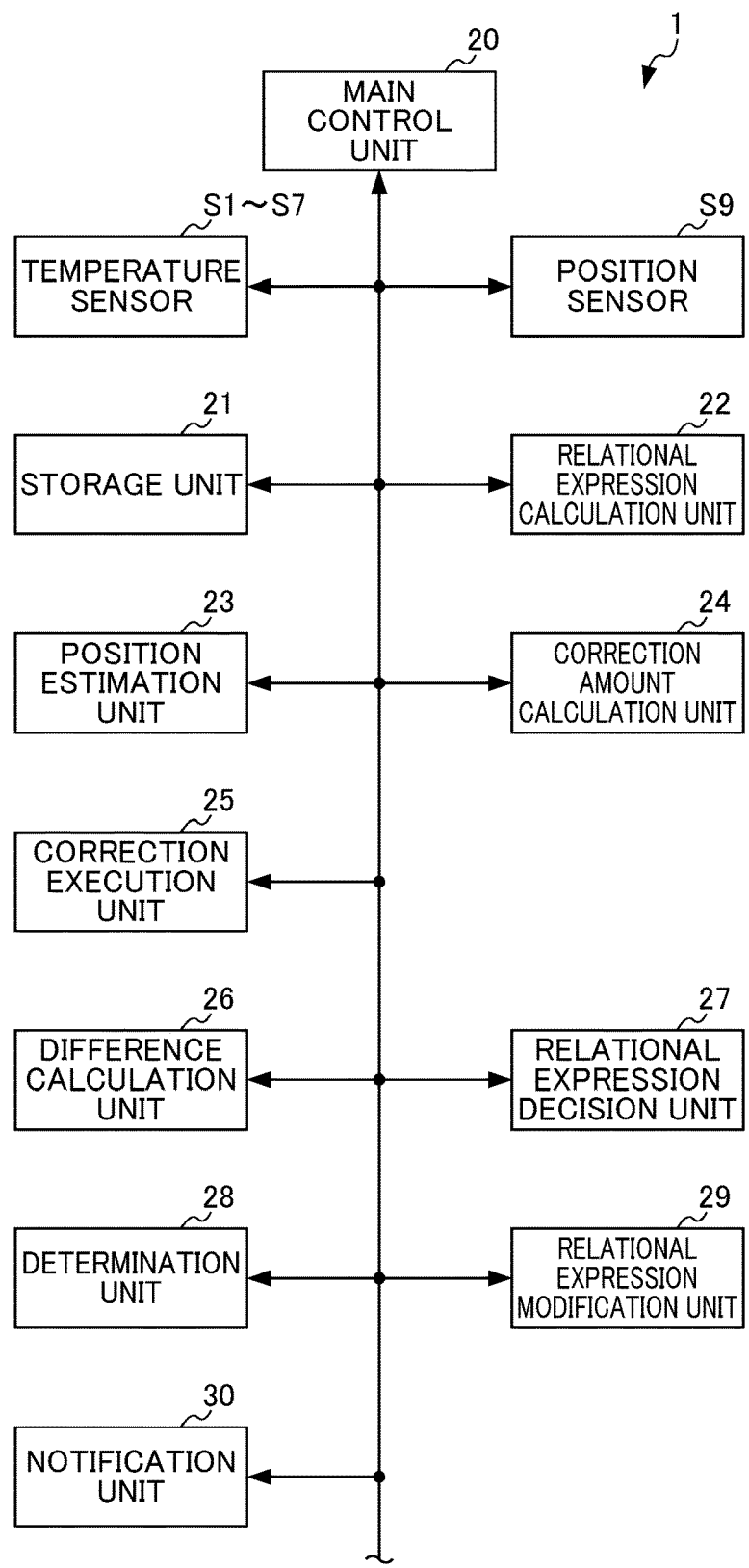
FIG. 6 is a block diagram showing a control system of a wire electric discharge machine according to a third embodiment of the present invention.
Figure 7:
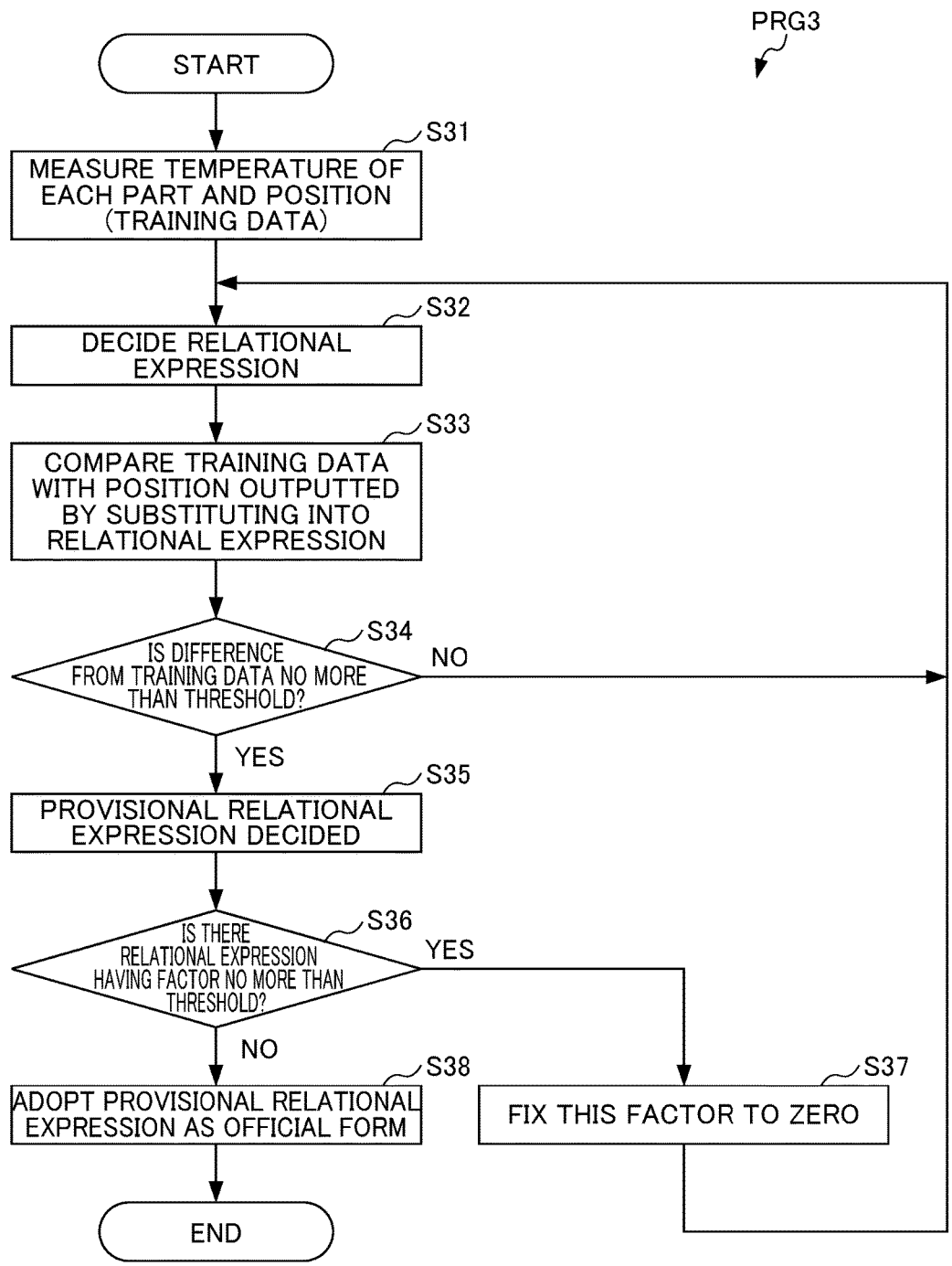
FIG. 7 is a flowchart showing a sequence of deciding a relational expression between the temperature of machine elements and relative positions of upper/lower guides, in the wire electric discharge machine according to the third embodiment of the present invention.

FIG. 6 is a block diagram showing a control system of a wire electric discharge machine according to a third embodiment of the present invention. FIG. 7 is a flowchart showing a sequence of determining a relational expression between the temperature of a machine element and the relative position of the upper/lower guides, in this wire electric discharge machine.

In this wire electric discharge machine 1 according to the third embodiment, a judgment unit 28 serving as a judgment means, a relational expression modification unit 29 serving as a relational expression modification means, and a notification unit 30 serving as a notification means are added in the control system thereof, as shown in FIG. 6. Since other configurations are basically the same as the aforementioned second embodiment, the same reference symbols are assigned for identical member, and explanations thereof are omitted.

The judgment unit 28 judges the magnitude of the influence imparted on the correction amount of the upper/lower guides 8, 15 by the temperature of the machine element, based on the relational expression determined as the formal relational expression by the relational expression decision unit 27.

The relational expression modification unit 29, in the case of the influence imparted on the correction amount of the upper/lower guides 8, 15 by the temperature of the machine element being small by way of the judgment unit 28, modifies the relational expression determined as the formal expression by the relational expression decision unit 27, by way of inferring the relational expression between the temperature of the machine element and the relative position of the upper/lower guides 8, 15 with the associated data excluding the temperature of this machine element as the training data, by way of machine learning.

The notification unit 30, in the case of the influence imparted on the correction amount of the upper/lower guides 8, 15 by the temperature of the machine element being judged as small by the judgment unit 28, notifies that the temperature sensor S detecting the temperature of this machine element can be removed. As the method of this notification, a method that appeals to the vision or hearing of an operator can be exemplified, for example.

Next, in the wire electric discharge machine 1 according to the present embodiment, a relational expression determination program PRG3 shown in FIG. 7 is followed upon obtaining the relational expression between the temperature of each machine element and the relative position of the upper/lower guides 8, 15.

First, in Step S31, the storage unit 21 executes the same processing as Step S11 in the aforementioned first embodiment.

Next, in Step S32, the relational expression calculation unit 22 executes the same processing as Step S12 in the aforementioned first embodiment.

Subsequently, in Step S33, the difference calculation unit 26 executes the same processing as Step S23 in the aforementioned second embodiment.

Next, in Steps S34 and S35, the relational expression decision unit 27 executes the same processing as Steps S24 and S25 in the aforementioned second embodiment.

Subsequently, in Step S36, the judgment unit 28 judges the magnitude of the influence imparted on the correction amount of the upper/lower guides 8, 15 by the temperature of the machine element, based on the relational expression determined as the formal expression by the relational expression decision unit 27. Therein, for the relational expressions, it is determined whether one for which the magnitude of the absolute value of factors C1 to C7 thereof is no more than a predetermined threshold is included. In the case of this determination being YES, since if it determined that the temperature of the machine element related to a factor of no more than this threshold has a small influence on the thermal displacement amount, the processing advances to Step S37, this item is removed from the relational expression by fixing this factor to zero, the processing returns to Step S32, and repeats the calculation of the relational expression by way of machine learning. On the other hand, in the case of this determination being NO, the temperature of the machine element to which the temperature sensor S is mounted is determined as having a great influence on the thermal displacement amount; therefore, the processing advances to Step S38, and the relational expression modification unit 29 determines this relational expression as the formal expression.

In addition, the notification unit 30 notifies that the temperature sensor S that detects the temperature of the machine element determined as having little influence imparted on the correction amount of the upper/lower guides 8, 15 can be removed, in place of the processing of Step S37 and later, or in addition to the processing of Step S37 and later.

Upon the relational expression between the temperature of each machine element and the relative position of the upper/lower guides 8, 15 by configuring in this way, this relational expression is stored. Then, upon the electric discharge machining of the work W, the thermal displacement correction of the upper/lower guides 8, 15 is performed using this relational expression, according to a similar sequence as the aforementioned first embodiment.

In the above way, the present embodiment exerts the same functional effects as the aforementioned second embodiment. In addition thereto, according to the present embodiment, it is possible to extract the temperature of the machine element having a great influence imparted on the thermal displacement amount, by confirming the presence/absence of a factor of no more than the predetermined threshold, for the relational expression between the temperature of each machine element and the relative positions of the upper/lower guides 8, 15. Therefore, it becomes possible to mount temperature sensors S to machine elements without being excessive or deficient.

Moreover, with the present embodiment, in the case of there being a temperature of a machine element determined as having little influence imparted on the correction amount of the upper/lower guides 8, 15, the notification unit 30 notifies that this temperature sensor S can be removed. Therefore, by an operator removing the temperature sensor S in accordance with this notification, it becomes possible to install temperature sensors S to machine elements without being excessive or deficient.

Other Embodiments

Although embodiments of the present invention have been explained above, the present invention is not to be limited to the aforementioned embodiments. In addition, the effects described in the present embodiments are merely exemplifying the most preferred effects produced from the present invention, and the effects according to the present invention are not to be limited to those described in the present embodiments.

For example, in the aforementioned first to third embodiments, cases of using a first order polynomial as the relational expression between the temperature of each machine element and the relative positions of the upper/lower guides 8, 15 are explained. However, provided that the influences of which temperature sensors S can be judged as being great, it will not cause a problem even if using any kind of relational expression, for example, adopting a second order polynomial or higher.

In addition, in the aforementioned first to third embodiments, the wire electric discharge machine 1 in which temperature sensors S are mounted to seven machine elements (bed 2, Y-axis saddle 10, working fluid inside of work pan 11, column 3, arm 13, V-axis saddle 5, U-axis saddle 6) has been explained. However, the mounting locations of the temperature sensors S are not limited to the aforementioned machine elements, and for example, temperature sensors S may be mounted to the X-axis saddle 9 and/or Z-axis saddle 7. Alternatively, it will not cause a problem even if mounting a plurality of temperature sensors S to any one machine element. Furthermore, the atmospheric temperature around the wire electric discharge machine 1 (for example, temperature in the vicinity of the bed 2) may be measured by a temperature sensor (not illustrated).

In addition, a wire electric discharge machine 1 of mobile-type upper guide 8 and fixed-type lower guide 15 has been explained in the aforementioned first to third embodiments. However, it is conversely possible to similarly apply the present invention to a wire electric discharge machine of fixed-type upper guide 8 and mobile-type lower guide 15. In addition, it is also possible to similarly apply the present invention to a wire electric discharge machine with both mobile-type upper guide 8 and lower guide 15.

EXPLANATION OF REFERENCE NUMERALS

1 wire electric discharge machine
2 bed (machine element)
3 column (machine element)
5 V-axis saddle (machine element)
6 U-axis saddle (machine element)
7 Z-axis saddle (machine element)
8 upper guide
9 X-axis saddle (machine element)
10 Y-axis saddle (machine element)
11 work pan (machine element)
12 work table (machine element)
13 arm (machine element)
15 lower guide
16 wire electrode
21 storage unit (storage means)
22 relational expression calculation unit (relational expression calculation means)
23 position estimation unit (position estimation means)
24 correction amount calculation unit (correction amount calculation means)
25 correction execution unit (correction execution means)
26 difference calculation unit (difference calculation means)
27 relational expression decision unit (relational expression decision means)
28 determination unit (determination means)
29 relational expression modification unit (relational expression modification means)
30 notification unit (notification means)
S, S1~S7 temperature sensor (temperature detection means)
S9 position sensor (position measurement means)
W work (workpiece)

What is claimed is:

1. A wire electric discharge machine configured from a plurality of machine elements, and performing electric discharge machining on a workpiece in a state in which an upper guide and a lower guide are disposed at predetermined relative positions, by causing the workpiece and a wire electrode installed between the upper guide and the lower guide to relatively move, the wire electric discharge machine comprising:
   a temperature detector for detecting temperatures of the plurality of machine elements;
   a position measurer for measuring an actual value for relative positions of the upper guide and the lower guide;
   a storage for storing the temperatures detected by the temperature detector and an actual value for the relative position measured by the position measurer to be associated with each other as associated data;
   a relational expression calculator for inferring and calculating a relational expression between the temperatures of the plurality of machine elements and the relative position by way of machine learning with the associated data stored in the storage as training data;
   a position estimator for calculating an estimated value for the relative position by substituting the temperatures detected by the temperature detector into the relational expression calculated by the relational expression calculator;
   a correction amount calculator for calculating a correction amount for the upper guide and the lower guide, based on the estimated value for the relative position calculated by the position estimator;
   a correction executor for performing correction of the relative positions of the upper guide and the lower guide, based on the correction amount calculated by the correction amount calculator;
   a difference calculator for comparing the estimated value for the relative position calculated by the position estimator with the actual value for the relative position among associated data stored in the storage, and calculating a difference therebetween;
   a relational expression decider for deciding, in a case of the difference calculated by the difference calculator being no more than a predetermined threshold, a relational expression used when calculating the estimated value for the relative position as a formal relational expression;
   a determinator for determining a magnitude of influence imparted by the temperature of one machine element from the plurality of machine elements on the correction amount for the upper guide and the lower guide, based on the relational expression decided as the formal relational expression by the relational expression decider; and
   a relational expression modifier for modifying the relational expression decided as the formal relational expression by the relational expression decider, by inferring a relational expression between the temperature of the one machine element and the relative position by way of machine learning, with associated data excluding the temperature of the one machine element as teaching data, in a case of the determinator determining that the influence imparted by the temperature of the one machine element on the correction amount for the upper guide and the lower guide is small.

2. A wire electric discharge machine configured from a plurality of machine elements, and performing electric discharge machining on a workpiece in a state in which an upper guide and a lower guide are disposed at predetermined relative positions, by causing the workpiece and a wire electrode installed between the upper guide and the lower guide to relatively move, the wire electric discharge machine comprising:
   a temperature detector for detecting temperatures of the plurality of machine elements;
   a position measurer for measuring an actual value for relative positions of the upper guide and the lower guide;
   a storage for storing the temperatures detected by the temperature detector and an actual value for the relative position measured by the position measurer to be associated with each other as associated data;
   a relational expression calculator for inferring and calculating a relational expression between the temperatures of the plurality of machine elements and the relative position by way of machine learning with the associated data stored in the storage as training data;

a position estimator for calculating an estimated value for the relative position by substituting the temperatures detected by the temperature detector into the relational expression calculated by the relational expression calculator;

a correction amount calculator for calculating a correction amount for the upper guide and the lower guide, based on the estimated value for the relative position calculated by the position estimator;

a correction executor for performing correction of the relative positions of the upper guide and the lower guide, based on the correction amount calculated by the correction amount calculator;

a difference calculator for comparing the estimated value for the relative position calculated by the position estimator with the actual value for the relative position among associated data stored in the storage, and calculating a difference therebetween;

a relational expression decider for deciding, in a case of the difference calculated by the difference calculator being no more than a predetermined threshold, a relational expression used when calculating the estimated value for the relative position as a formal relational expression;

a determinator for determining a magnitude of influence imparted by the temperature of one machine element from the plurality of machine elements on the correction amount for the upper guide and the lower guide, based on a relational expression decided as a formal relational expression by the relational expression decider; and a notifier for notifying, in a case of the determinator determining that the influence imparted by the temperature of the one machine element on the correction amount for the upper guide and the lower guide is small, that a temperature detector detecting the temperature of the one machine element can be removed.

3. The wire electric discharge machine according to claim 1, further comprising:

a notifier for notifying, in a case of the determinator determining that the influence imparted by the temperature of the one machine element on the correction amount for the upper guide and the lower guide is small, that a temperature detector detecting the temperature of the one machine element can be removed.

4. The wire electric discharge machine according to claim 1, wherein the plurality of machine elements includes a bed, a U-axis saddle and a work pan, wherein the temperature detector detects ambient temperature in a vicinity of the bed, temperature of the U-axis saddle, and temperature of a working fluid inside of the work pan.

5. The wire electric discharge machine according to claim 2, wherein the plurality of machine elements includes a bed, a U-axis saddle and a work pan, wherein the temperature detector detects ambient temperature in a vicinity of the bed, temperature of the U-axis saddle, and temperature of a working fluid inside of the work pan.

6. The wire electric discharge machine according to claim 3, wherein the plurality of machine elements includes a bed, a U-axis saddle and a work pan, wherein the temperature detector detects ambient temperature in a vicinity of the bed, temperature of the U-axis saddle, and temperature of a working fluid inside of the work pan.

* * * * *